(12) United States Patent
Anand et al.

(10) Patent No.: US 7,061,304 B2
(45) Date of Patent: Jun. 13, 2006

(54) FUSE LATCH WITH COMPENSATED PROGRAMMABLE RESISTIVE TRIP POINT

(75) Inventors: Darren L. Anand, Essex Junction, VT (US); John A. Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 10/707,963

(22) Filed: Jan. 28, 2004

(65) Prior Publication Data

US 2005/0162799 A1    Jul. 28, 2005

(51) Int. Cl.
*H01H 37/76* (2006.01)

(52) U.S. Cl. .................................................. 327/525

(58) Field of Classification Search ................ 327/525
See application file for complete search history.

(56) References Cited

U.S. PATENT DOCUMENTS

| | | | |
|---|---|---|---|
| 4,215,282 A | 7/1980 | Brown et al. | 327/82 |
| 5,081,380 A | 1/1992 | Chen | 327/262 |
| 5,289,412 A * | 2/1994 | Frary et al. | 365/185.21 |
| 5,336,986 A | 8/1994 | Allman | 327/541 |
| 5,568,084 A | 10/1996 | McClure et al. | 327/538 |
| 5,640,122 A | 6/1997 | McClure | 327/530 |
| 5,796,663 A | 8/1998 | Park et al. | 365/225.7 |
| 5,892,716 A * | 4/1999 | Ingalls | 365/189.05 |
| 5,978,297 A * | 11/1999 | Ingalls | 365/225.7 |
| 6,348,827 B1 | 2/2002 | Fifield et al. | 327/278 |
| 6,377,113 B1 * | 4/2002 | Kanno | 327/543 |
| 6,384,666 B1 | 5/2002 | Bertin et al. | 327/525 |
| 6,400,202 B1 | 6/2002 | Fifield et al. | 327/291 |

\* cited by examiner

*Primary Examiner*—Phuong T. Vu
*Assistant Examiner*—Scott Bauer
(74) *Attorney, Agent, or Firm*—Michael J. LeStrange

(57) ABSTRACT

A fuse latch circuit with a current reference generator is described where the resistive switch point of the latch is stabilized against effects of manufacturing processing, operating voltage and temperature. A digital control word is used to select the desired resistive trip point of the fuse latch and compensation within the reference generator maintains this resistive trip point with high accuracy. The variable resistive trip point is set to a first value at test and then to a second value in use condition to enhance operating margin, and soft error immunity.

20 Claims, 7 Drawing Sheets

US 7,061,304 B2

FUSE LATCH WITH COMPENSATED PROGRAMMABLE RESISTIVE TRIP POINT

BACKGROUND OF INVENTION

1. Field of the Invention

The technical field of the invention is that of integrated circuits and, in particular, memory circuits having programmable fuse elements, particularly antifuses.

2. Description of the Related Art

Fuses and antifuses are used to personalize semiconductor devices to meet specific integrated circuit requirements. To personalize a semiconductor device with fuses, some of the available fuses are blown by a laser or other means to make the desired changes to the device and its associated circuits. Fuses are blown to make a previously closed connection open. Antifuses are also used to personalize semiconductor devices. Antifuses are devices that perform the opposite function of a fuse.

In this application, the term "fuse element" will be used to cover both fuses and antifuses, both of which can be used with the latch device and programming circuits of the present invention. The term "fuse latch" will be used to reference a latch device that can be used for both fuses and antifuses.

Related art fuse latches also lacked a means for determining if an antifuse programmed successfully, and for testing the resistance margin over what resistance value is required by the fuse latch for proper sensing. Another problem with high-trip point fuse latches in the related art is their sensitivity to electrical disturbances, which sometimes cause soft error upsets or failures of the fuse latch. A means for adjusting the resistive trip point of the fuse latch and for improving the immunity of the fuse latch to soft error failures is therefore needed, particularly after the latch is set.

SUMMARY OF INVENTION

Fuse technology is changing as industry migrates from laser to electronic fuses. Traditional laser fuse technology provides many orders of magnitude difference in resistance between an intact or "unprogrammed" fuse and a blown or "programmed" fuse. Such a definitive change in resistance could make it easy to design and manufacture an operable and highly reliable fuse latch circuit.

Electronic fuse technologies offer improved density with a smaller fuse element, enable module level programming after module fabrication, testing and burn in stressing. Further it would enable for in-use or field level programming not possible with traditional laser programmed fuses. However, the resistance change between programmed and unprogrammed electronic fuse elements may be as little as 1–2 orders of magnitude, and the absolute value of an electronic fuse's resistance changes as fuse technology evolves. Currently, there are numerous types of fuses, such as: metal fuses, tungsten-poly fuses, cobalt-poly fuses, intrinsic-poly fuses as well as metal-on-metal antifuses and many combinations of 2-element parallel plate conductor-insulator-conductor antifuse structures. Each of these structures has unique programmed and unprogrammed resistances, or conduction values, and it is difficult to differentiate between programmed and unprogrammed fuses states with the traditional prior art fuse such as those described in U.S. Pat. Nos. 5,345,110 and 6,384,666 which are hereby incorporated by reference. While U.S. Pat. No. 6,384,666 teaches programmable switchpoint latch, it's resistive switchpoint still varies as process voltage and temperature (PVT) alter the latch unity-gain point. It has also been shown that the resistance of a programmed fuse or antifuse may change over time as a result of voltage stress.

It is an object of the present invention to improve the fuse latch circuit with a programmable resistive trip point to optimize centering of the resistive trip point (ie., the latch having a different output state above or below a certain resistance). Another object is to allow for noise margin. A further object is to provide a variable trip point latch that can be useful in effecting a manufacturing fuse margin test to improve tolerance to drifting of the fuse resistance. An additional object is to improve the accuracy of a variable trip point fuse latch by compensating for variations in the switching characteristics of a cross-coupled latch.

DETAILED DESCRIPTION

The prior art will now be described in detail with reference to FIGS. 1 and 2 of the accompanying drawings.

Figure 1:
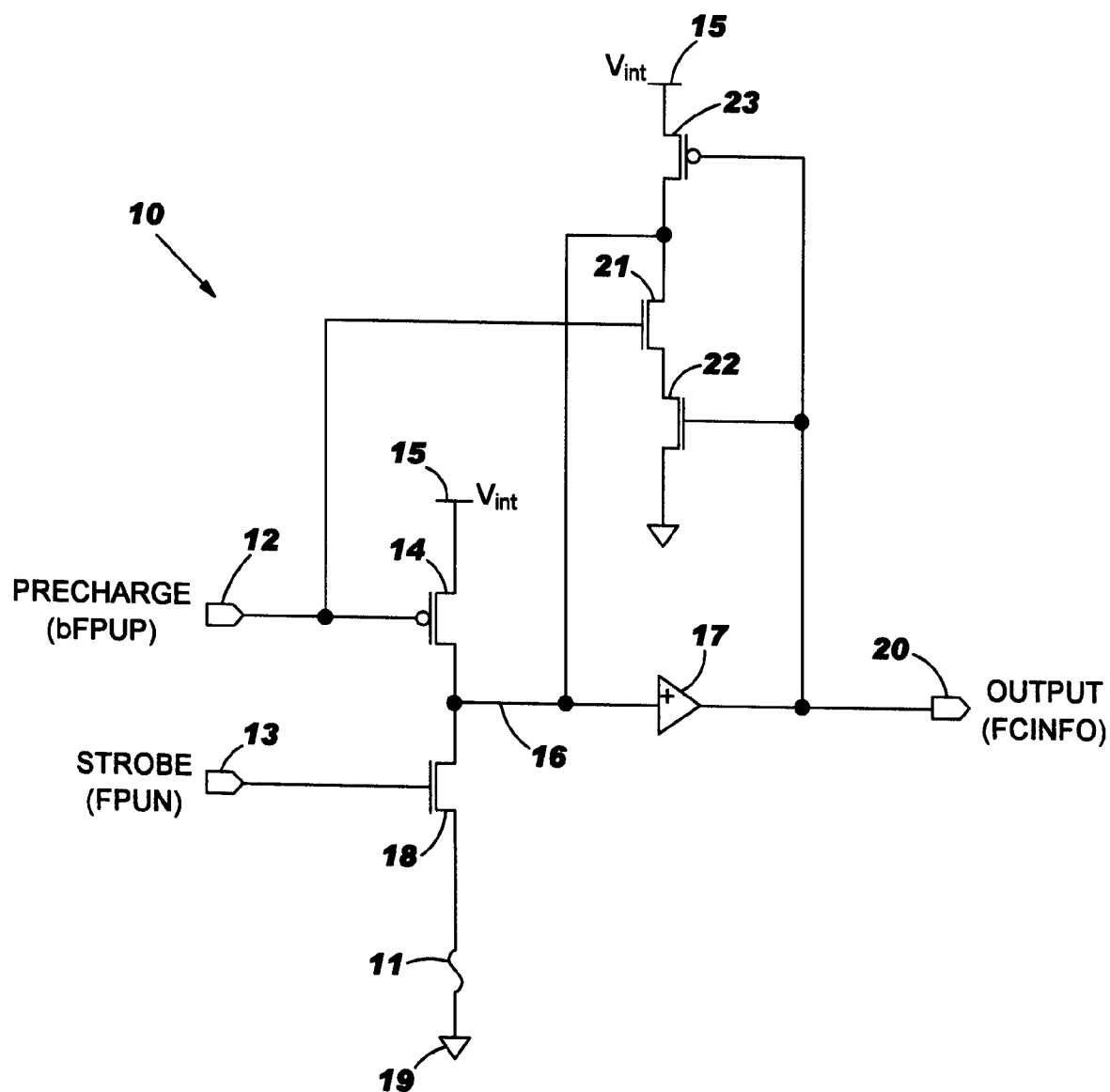
FIG. 1 is a schematic circuit diagram of a conventional fuse latch.
Figure 2:
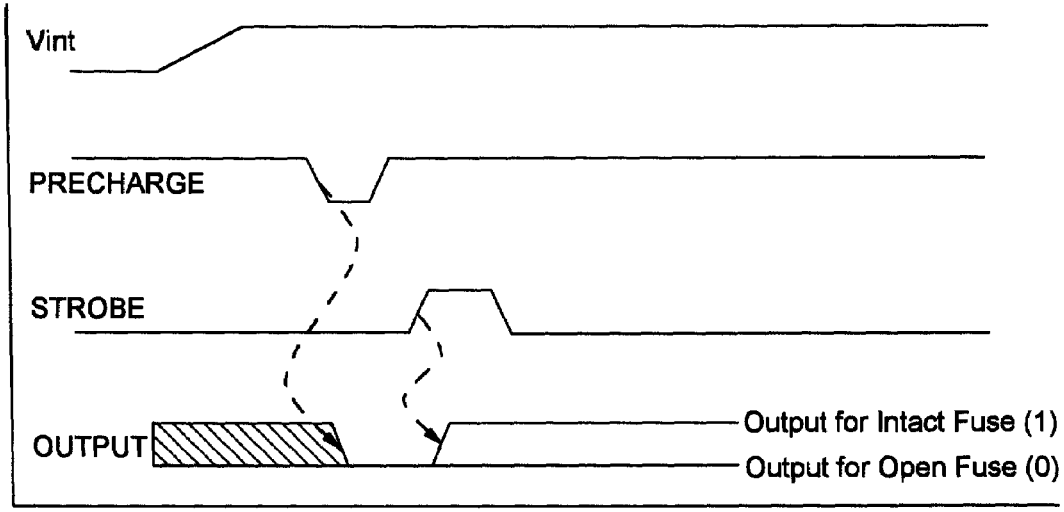
FIG. 2 is a voltage timing diagram of the inputs to the conventional fuse latch device.

FIG. 1 shows a circuit of a typical fuse latch 10 used on an integrated circuit. The fuse latch 10 operates to read the state of a fuse 11 to determine if the fuse is programmed or unprogrammed. The fuse latch circuit 10 has a precharge input (bFPUP) 12 and a strobe input (FPUN) 13. The precharge input 12 is connected to a first PFET 14 and operates to gate the power supply Vint 15 down to the internal node 16 of the latch 10, which is connected to an inverter 17. The internal node 16 is precharged to a high state by a pulse from the precharge input 12, and the internal node 16 stays in the high state after the precharge input pulse is removed.

The strobe input 13 is connected to a first NFET 18 which operates to gate the internal node 16 to the fuse element 11. When a pulse is delivered to the strobe input 13, the first NFET 18 is turned on to connect the internal node 16 to the fuse element 11. If the fuse element 11 is an unprogrammed fuse (i.e., it is a short circuit), then the charge stored on the internal latch node 16 is discharged through the fuse element 11 to the ground 19. The inverter 17 then flips state and changes the output 20 of the latch 10 to reflect that the fuse element 11 is unprogrammed.

In contrast, if the fuse element 11 is a programmed fuse (i.e., it is an open circuit), then the charge stored on the internal latch node 16 is not discharged through the fuse element 11 when the first NFET 18 is turned on. The charge stored on the internal latch node 16 thus stays the same and does not cause the inverter 17 to flip state or change the output 20 of the latch 10. The latch 10 has a first logical state for a programmed fuse, and a second logical state for an unprogrammed fuse. The logical state 10 of the latch is stored by the latch circuit until the power supply Vint 15 is removed. The latch 10 has two NFETs 21, 22 and a PFET 23 that provide feedback elements for the latch 10.

The timing diagram for the fuse latch 10 described above is shown in FIG. 2. The timing sequence is that Vint comes on (i.e., power-up occurs). Then the precharge input 12, which is started low, goes high, which is its inactive state. The fuse element 11 can then be polled or interrogated by providing a positive pulse of short duration as the strobe input 13. The strobe input 13 then returns to ground.

The typical fuse latch 10 described above does not have a means for adjusting the resistive trip point of the latch in a controlled and predictable manner. The fuse latch 10 has a fixed trip point. This is significant because the amount of current that flows through the PFET 23 affects the operation of the latch circuit and is a function of process, voltage and temperature (PVT). Different values of PVT will cause the trip point of the latch circuit to be varied unintentionally, thereby causing uncertainty in the latch operation, particularly when this fuse latch 10 is used with an electrically blown fuse element, such as an antifuse. While metal fuses typically provide a very distinct short circuit or open circuit, electrically blown fuses such as antifuses do not. That is, the range of resistance change between programmed and unprogrammed states of an antifuse is not as distinct as with metal fuses.

For example, a fuse latch for a fuse might be designed to have a 100 kOhm trip point (i.e., the latch is designed to have a different output state when a sensed fuse element 11 has less than 100 kOhm resistance than when the sensed fuse element 11 has more than 100 kOhm resistance). However, a different value of PVT might change the actual trip point to 55 kOhms. If the latch is connected to an electronic fuse element 11 having 55 kOhms in its programmed or unprogrammed state, for example, the latch cannot reliably discern the programmed state of the fuse element 11. The latch 10 also does not provide a means for margin testing or for placing the latch in an operating state that enhances the soft error immunity of the latch circuit.

Figure 4:
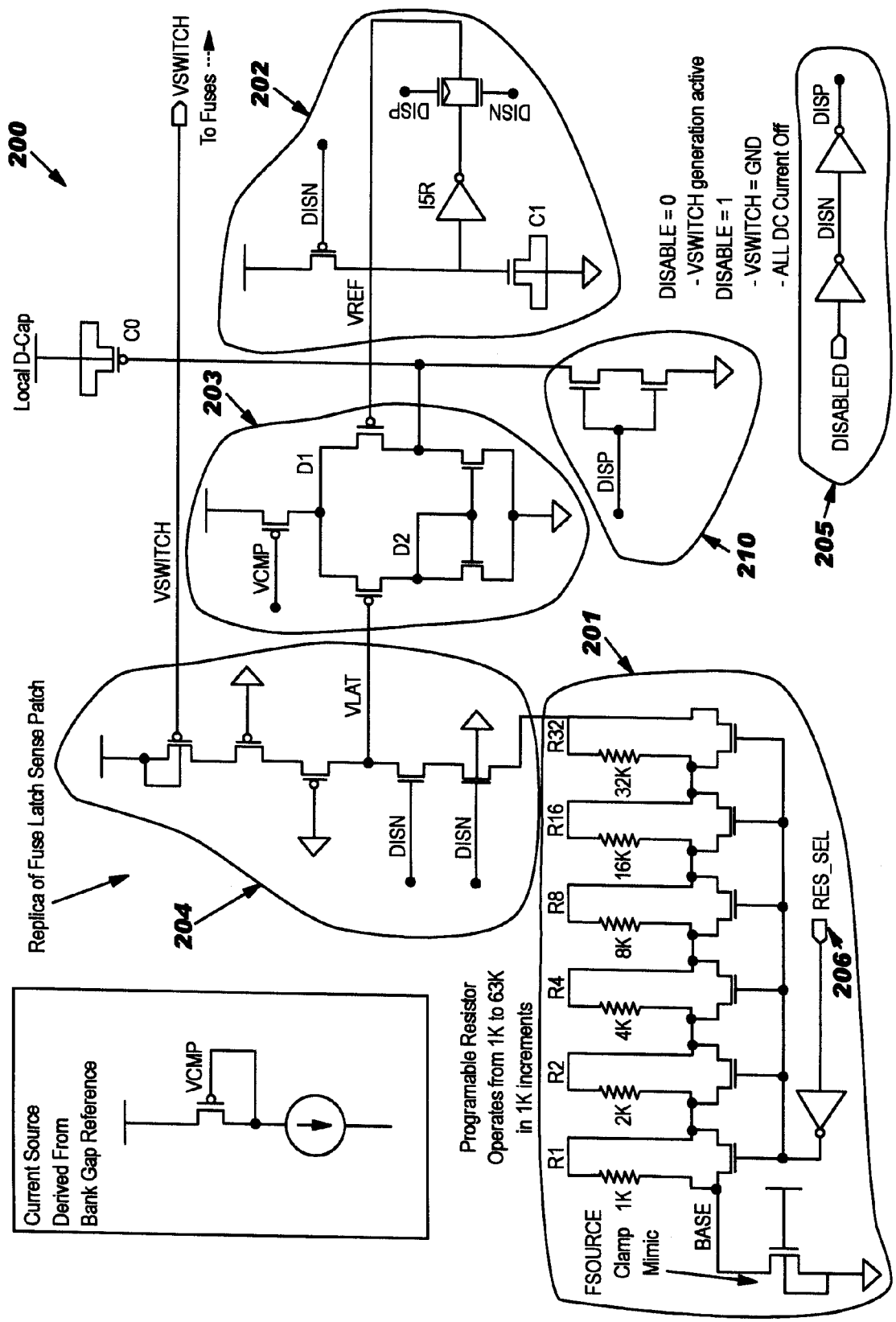
FIG. 4 is a schematic diagram of a variable resistive trip point fuse latch using a compensated current source reference in accordance with the present invention.

It is also known that the Programmed resistive value of an electronic fuse or antifuse can change overtime as a function of stress. An e-fuse with a programmed resistance value of 2000 ohms could drift to a lower value as a result of electrostatic stress. Such an example is shown and described in U.S. Pat. No. 6,384,666. It is therefore desirable to perform a margin test on programmed fuse elements to allow for drift in programmed resistance. Attention is directed to FIG. 4 which is a schematic of a variable resistive trip point fuse latch 100 in accordance with the present invention. This circuit is designed to read the state of an efuse element 101 and store its value as a digital state in latch (L2) 104. Programming of a specific efuse within a bank of efuse latches is previously established by selecting a desired programming gate 108, and applying a high voltage at the input (FSOURCE) 112 with sufficient current to melt the efuse 101 and alter its resistance. An antifuse is programmed by similar selection of a programming gate and applying a high voltage with current sufficient to breakdown the insulator and create a conductive link between its parallel plates, thereby altering its conductive properties. Programming voltage is applied to terminal (FSOURCE) 112 only during programming and is held at GND during fuse sensing and thereafter. Device 114 isolates the latch circuitry from high voltage during programming.

The variable trip point latch consists of (L1) (L2) latch structures 103 and 104 respectively, feedback isolation buffer 102, current source 116 with control gate (VSWITCH) 106, efuse element 101, and programming device 108, initializing devices 118 and set device 120, data transfer passgates 129 and 130; and FSOURCE shunt device 131 and isolation device 114.

Figure 3:
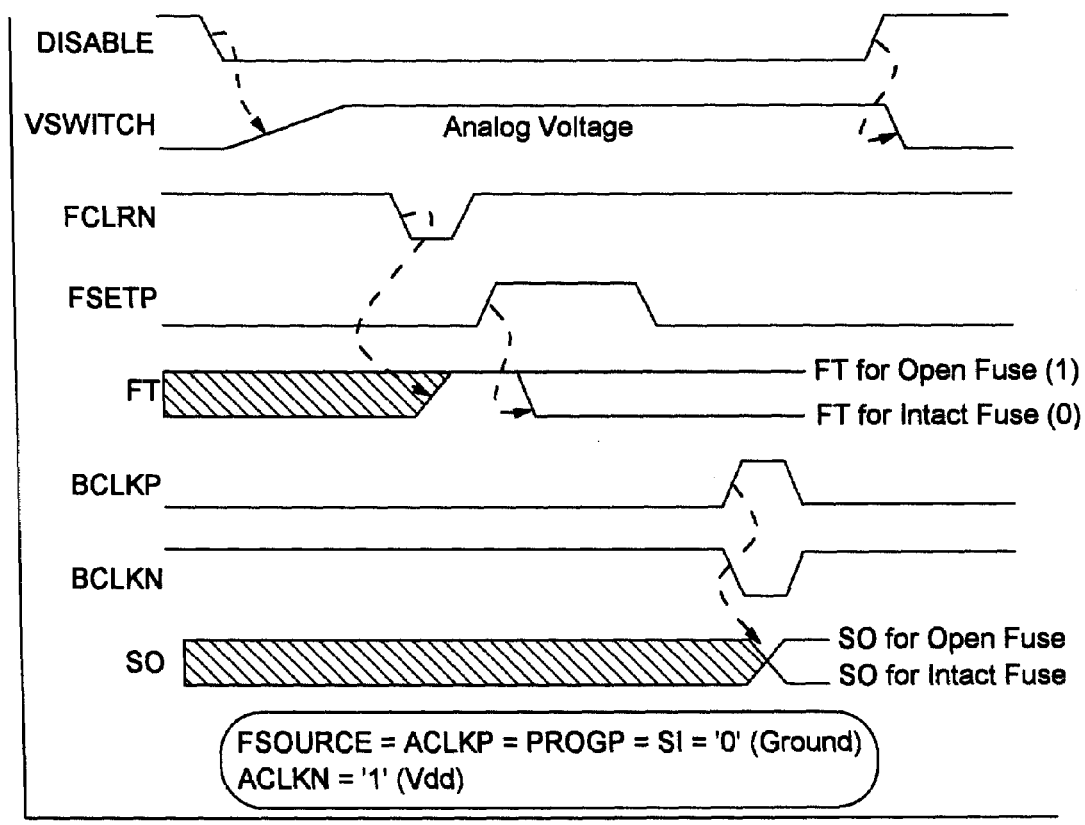
FIG. 3 is a timing diagram of the inputs used in the fuse latch device shown in FIGS. 4 and 5.

Read operation is shown in FIG. 3 by an initialization signal that is applied at 126 (FCLRN) which pulses low to initialize (L1) 103 latch input (FT) 122 to a high state. A current level is set from current source 116 by reference level (VSWITCH) 106 and this predetermined amount of current I0 flows into efuse 101 when (FSETP) 114 activates set device 120 and shunt device 131. The voltage at (L1) 103 input node (FT) 122 is now essentially a function of the current (I0*R_efuse). The resistive effects of all other devices conducting I0 are compensated out by Reference Generator 200 in FIG. 5 and will be discussed hereinafter. If the fuse resistance R_efuse is BELOW the desired latch trip point or unity gain point, the voltage on input node (FT) 122 will be BELOW the latch-voltage trip point and the latch will change from its first initialized state to a second low state. If R_efuse has a resistance HIGHER than the desired latch trip point then the voltage on input node (FT) 122 will be HIGHER than the latch-voltage trip point and the latch will remain in its initialized first state.

Figure 5:
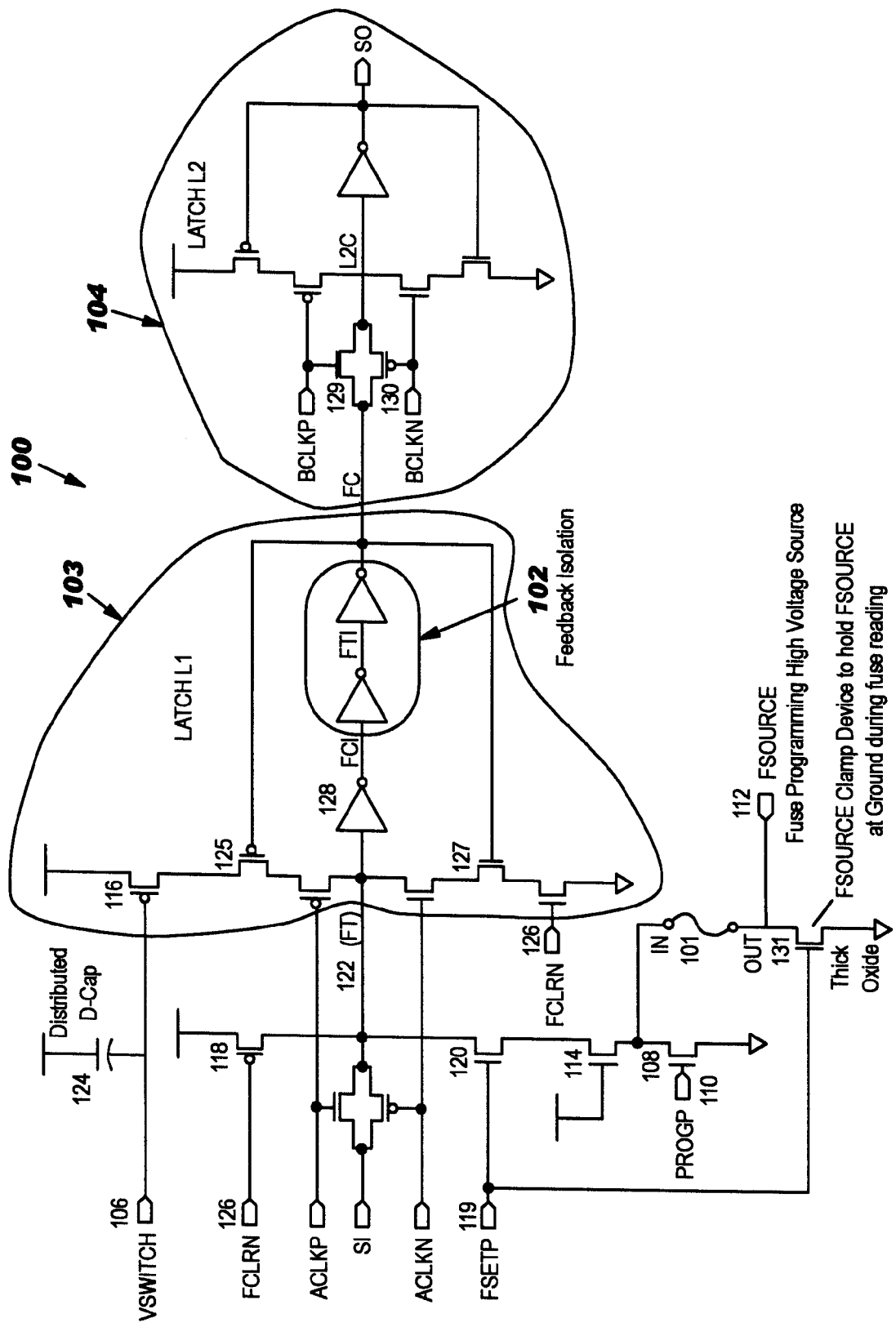
FIG. 5 is a schematic drawing of a single Reference Level Generator controlling a bank of multiple variable resistive trip point latch circuits shown in FIG. 4.
Figure 6:
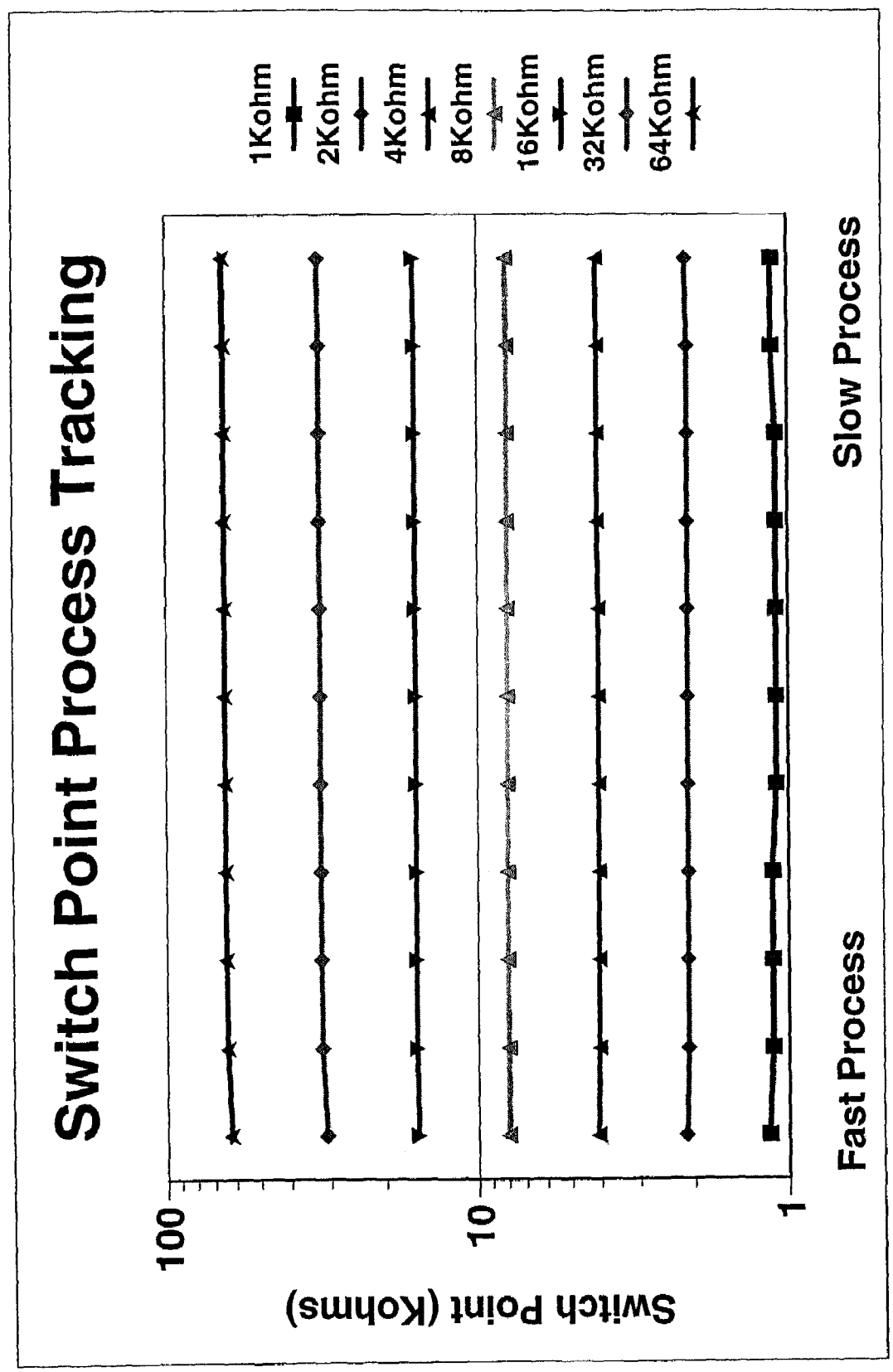
FIG. 6 is a graph showing the resistive trip point stability as a function of manufacturing processing.

Another feature of this circuit is to provide an isolation buffer 102 in the latch feedback path to maintain the gate of feedback devices 125 at ground to achieve constant conduction during sensing, This is essential for accurate calculation of the resistive trip point of the latch by the Reference Current Generator circuit 200 shown in FIG. 5 Local decoupling on the (VSWITCH) 106 reference line is provided by capacitor 124.

The present invention uses an active circuit wit feedback to find a reference current which will make the latch input voltage equal to the latch-inverter trip point at a selectable fuse resistance value. Referring to FIG. 5, a latch-mimic circuit receives this reference current and the latch-input voltage is monitored by the (+) input of a diff-amp, which is compared to the latch-inverter trip point(−) as calculated by the reference inverter (I5R) biased at its trip point. The diff-amp outputs a voltage (VSWITCH) which will bias the current source in the latch-mimic circuit such that the (−) and (+) terminals are substantially equal to zero. This makes the latch input voltage equal to the latch-inverter switch point at the selected fuse reslstance.In order for the current reference generator to work well, the L1 latch in 103 must switch as an inverter— not as a latch. This means the feedback devices coupled to the latch input nodes 125, 127 must be completely on or off during switching so as not to add some unpredictable current into the input node during switching. In a simple latch design, as the output switches the output creeps up a fraction of a volt. This fraction of a volt when coupled to the feedback devices alters their conduction and further enhances switching by altering the switch point until the latch flips. A latch switch point is dynamic, it changes during switching. It is necessary to stabilize the latch trip point to make it predictable and equate it to the latch input voltage. The latch trip point is held constant by preventing creep-up of the feedback gates by inclusion of the 2 feedback isolation inverrers (102). They act as a filter or buffer and will not propagate a partial level, but switch when the input inverrer 128 is fully switched.

This design is capable of providing a variable trip point latch using a first reference current level for normal fuse sensing and a second current level during a margin test to provide operating margin. For example, if a desired trip point of 110K-ohms is required for normal sensing it would improve reliability and add noise margin if the fuses were tested at a 90K-ohm trip point but sensed at a 100K-ohm trip point in normal operation. This insures that if the programmed resistance dropped back closer to the lower, unprogrammed value after stress the latch would still read the programmed fuse correctly.

A further feature of the present invention is to provide a variable trip point latch with the ability to sense a fuse using a first reference current level and once sensing mode is completed, maximize this current to provide larger latch-feedback current to enhance soft error upset Soft Error Upset (SEU) immunity. This is done by allowing the (VSWITCH) 106 level to be controlled by Reference Current Generator 200 during sensing and margin testing, but disabling it and clamping it to GND for normal operation. With (VSWITCH) 106 at GND, current control device 116 provides its maximum current into L1 latch 103. In an SEU node (FT) 122 is partially discharged toward GND, and with current supply device 116 providing its maximum level it is now able to supply typically 10× more current than it could when at its appropriate level for a trip point of 100K-ohms. Hence, the first current level is optimized for fuse reading and is only utilized at power up which reduces the window of vulnerability to a fraction of a second. The second full-on state is present for the thousands of power-on hours over the life of the circuit.

The (VSWITCH) 106 current reference is created by Reference Current Generator 200 in FIG. 5. It consists of a Resistor selection block 201, an inverrer switch point reference 202, operational amplifier 203, latch mimic 204 and disable phase generator 205. The object of circuit 200 is to provide a reference level on output VSWITCH which will provide appropriate current into variable ulp point lath circuit(s) 100 in order to accurately preselect its resistive tip point. A further object of this circuit is to provide compensation means so as to make any trip point variations from process, voltage and temperature (PVT) essentially zero. In operation, if a resistive trip point of 100K-ohms is desired for example, the Resistor selection block 201 is set to a resistor value of 100K-ohms by appropriate selection of digital control word RES_SEL (0-n) 206 to select the correct series resisise in this digital to resistance converter. Inverter switch point reference 202 will output the unity gain point of the Inverter I5R having beta ratios and geometry identical to its corresponding inverter 128 in the variable trip point latch 100 in FIG. 1. Decap capacitor C1 offsets displacement noise from op-amp 203. VREF provides a target for node VLAT to follow. Latch mimic 204 represents all the series impedances present in the I0 current path in latch 100. Op amp 203 uses negative feedback to find a voltage VSWITCH which will make node VLAT essentially equal to the latch inverter 128 switch point when the "fuse" resistance is 100K-ohms. Once generated by this low current circuit, VSWITCH is applied to multiple fuse latch 100 circuits to control the resistive trip point of all in unison. Large decap capacitor C0 is used to offset displacement current from latch circuits 100 and line to line noise.

Other resistive trip points are easily selected by adjustment of digital control word RES_SEL (0-n) which can be controlled by metal mask wiring, laser fuses or other efuse elements or form off chip control wiring. Once fuse read is complete the VSWITCH level is best set to GND to enhance SEU immunity as described above. This is done via DISABLE input and phase generators 205, which cut off all Reference Generator Circuit power consumption and with clamp device 210. Op-amp current can also be cut off by Disable feature (not shown in diagram).

Reference Current Generator 200 will adjust the VSWITCH point to gate the proper amount of current into the fuse latch current device 116 to insure the latch inverter 128 will switch when the fuse resistance is at a predetermined value. If die switch point of 128 changes due to PVT, then (VSWITCH) 106 level changes accordingly. As other element values change from PVT, the VSWITCH level will adjust to keep the resistive trip point constant. Larger than minimum geometry devices are used in the circuit layout to improve parametric tracking between the Reference Current Generator 200 and the fuse latches 100.

Alternate structures for resistive selection 201 can be made using parallel or series parallel arrangements of resistive elements. This structure can be entirely synthesized using active circuits, or transistor circuits. What is needed is a block 201 which has a first input node and a second output node and a programmable ratio of the voltage across the first and second nodes to the current conducting between them $R=V/I$.

It is envisioned that other designs may be used for construction of a compensated variable resistance fuse latch similar to those discussed above. For example, the latch could use an NFET current mirror instead of a PFET with similar and appropriate changes to Reference Current Generator 200. The SEU enhancement could come from an additional current supply device in parailel with current source 116 which is switched on after fuse read. It should be understood that the variable trip point latch does not need to be an (L1)(L2) scanable latch, and could be a simpler latch employing a simple cross-coupled latch for 103, however accuracy may be traded for simplicity in many of these alternate embodiments.

Figure 7:
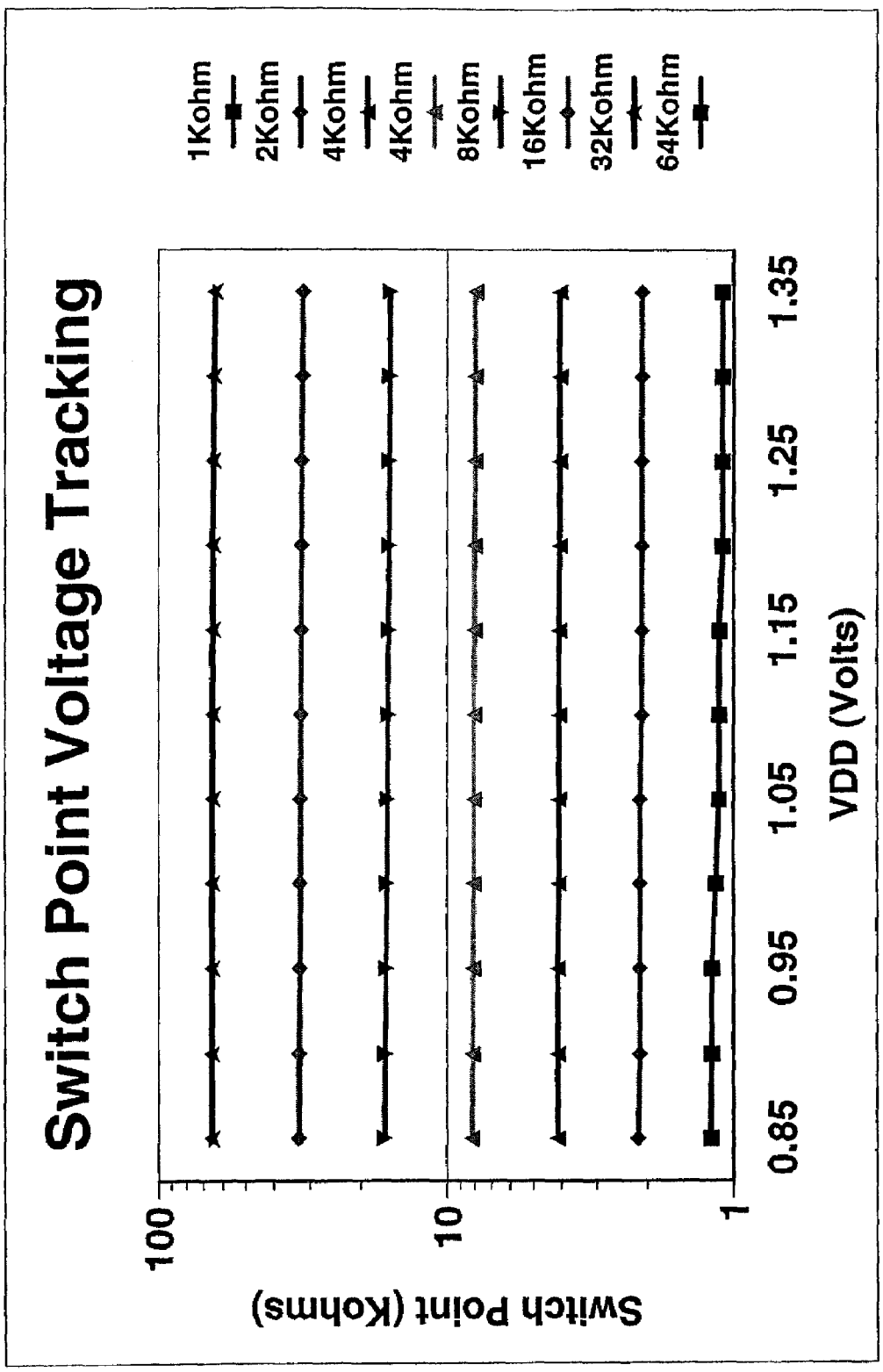
FIG. 7 is a graph showing the resistive trip point stability as a function of Voltage.
Figure 8:
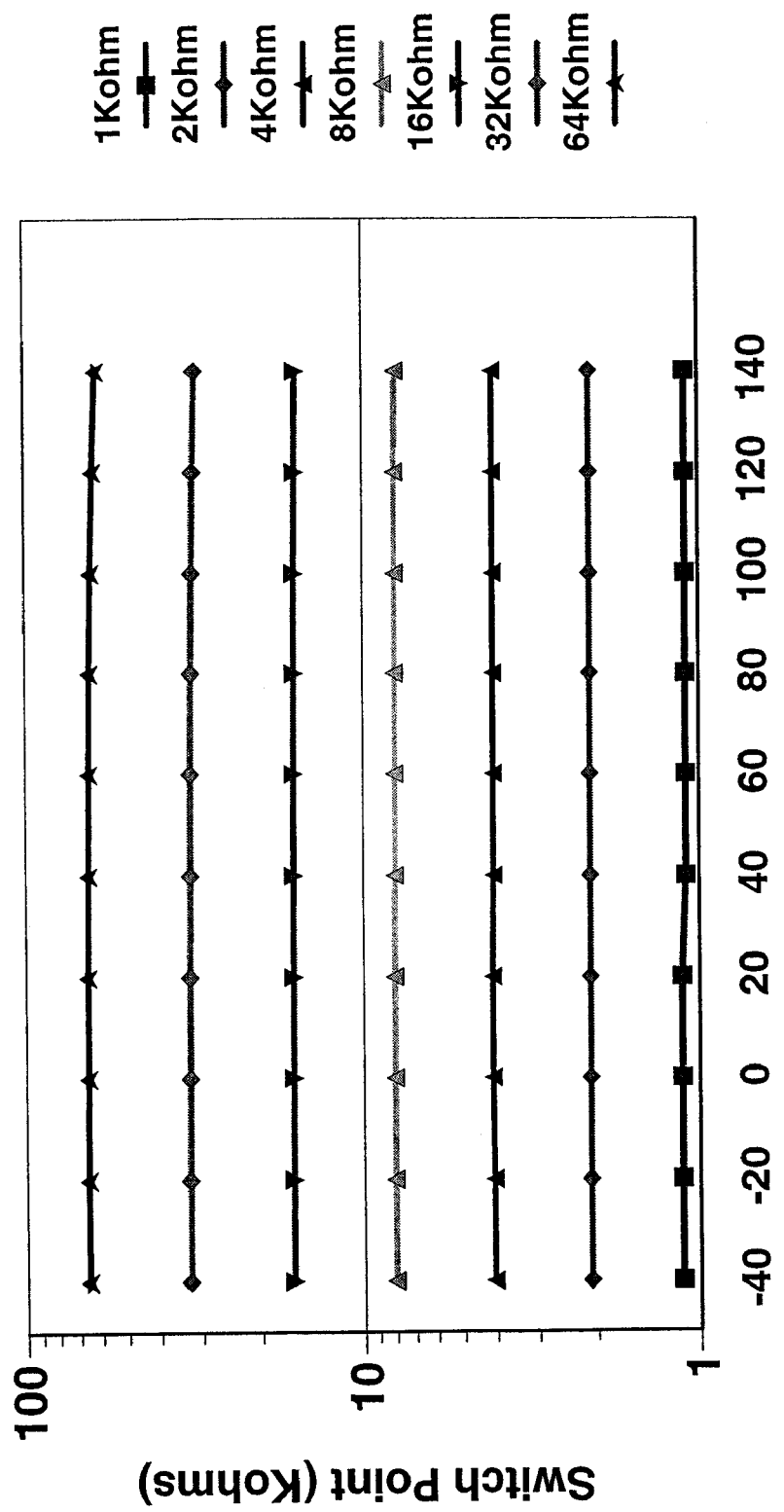
FIG. 8 is a graph showing the resistive trip point stability as a function of Temperature.

FIG. 5 shows the resistive trip point stability of the inventive structure as manufacturing process is changed from a +3Sigma fast process to a −3Sigma slow process. Programmed resistive trip points are largely unchanged over the range. Similarly, in FIG. 7, resistive trip point is shown to be stable over voltage range and in FIG. 8 resistive trip point is shown to be largely independent of temperature.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teachings without departing from the spirit and scope of the following claims.

What is claimed is:

1. A latch device having a variable resistive trip point, comprising:
   a voltage source;
   an adjustable trip point current reference;
   a latch circuit having a fuse latch output; and
   a trip point control element, said trip point control element being operable to control the amount of current passing through said latch circuit based on said adjustable trip point current reference that is compensated by a latch mimic circuit.

2. The latch device as set forth in claim 1, wherein said trip point control element is a transistor, and wherein a gate of said transistor is connected to said adjustable trip point current reference that is compensated by a latch mimic circuit.

3. The latch device as set forth in claim 2, wherein said transistor has a source connected to said voltage source and a drain connected to said latch circuit, wherein a change in said adjustable trip point current reference changes an amount of current flowing through said transistor into said latch circuit.

4. The latch device as set forth in claim 1, including a feedback circuit to determine the reference current that will make the latch input voltage equal to the latch-inverter trip point.

5. The latch device as set forth in claim 4, wherein the latch mimic circuit receives the reference current and the latch voltage is monitored by a differential amplifier.

6. The latch device as set forth in claim 5, wherein an antifuse element is coupled to the latch device.

7. The latch device as set forth in claim 1, wherein said adjustable trip point current reference further comprises a weighted binary adjustment circuit.

8. The latch device as set forth in claim 1, further comprising a trip point current reference circuit for developing said adjustable trip point current reference, said trip point current reference circuit having a plurality of selectable inputs for changing the adjustable trip point current reference.

9. The latch device as set forth in claim 8, wherein said plurality of inputs are connected to a plurality of reference transistors configured to produce a binary weighted adjustment of the trip point current reference.

10. The latch device as set forth in claim 1, further comprising a trip point current reference circuit for developing said adjustable trip point current reference using a current mirror control.

11. The latch device as set forth in claim 1, further comprising a trip point current reference circuit for developing said adjustable trip point current reference, said trip point current reference circuit comprising a bandgap current reference.

12. A latch device having a variable resistive trip point, comprising:
   a voltage source;
   an adjustable trip point current reference;
   a latch circuit having a fuse latch output;
   a trip point control element, said trip point control element being operable to control the amount of current passing through said latch circuit based on said adjustable trip point current reference that is compensated by a latch mimic circuit; and
   a buffered latch to prevent creep up from altering the switch point of the latch output.

13. The latch device as set forth in claim 12, wherein said latch circuit has a polling transistor comprising a source, a drain and a gate, the gate being connected to a strobe signal input, said polling transistor being operable to poll a fuse connected to the latch circuit when the strobe signal input is in an active state.

14. The latch device as set forth in claim 13, further comprising a trip point current reference circuit for developing said adjustable trip point current reference, and wherein said strobe signal input is connected to a bypass transistor in said trip point current reference circuit to adjust said adjustable trip point current reference to a state in which said trip point control element allows a maximum amount of current to pass from said voltage source into said latch circuit when said strobe signal input is in its inactive state.

15. The latch device as set forth in claim 12, wherein said trip point control element is operable to provide the latch device with at least a first trip point for testing a resistance margin of a fuse element, a second trip point for improving soft error immunity, and a third trip point for normal operation.

16. The latch device of claim 12 wherein at least one buffer stage is inserted between an input inverter of the fuse latch and its feedback devices.

17. The latch device as set forth in claim 12 wherein the reference current is compensated for process, voltage or temperature.

18. A latch device having a variable resistive trip point comprising:
   a voltage source;
   a latch circuit having a fuse latch;
   a trip point control means to control the current passing through a fuse coupled to the latch circuit;
   a compensated current source adapted to adjust for variation of a trip point voltage of the fuse latch caused by variations in manufacturing process and operating temperature and voltage; and
   a voltage mimic circuit and operational amplifier coupled to the fuse latch to adjust the fuse latch trip point voltage.

19. A method to control a variable resistive trip point fuse latch having a plurality of fuse elements with differing states comprising:
   determining the state of the fuse elements;
   storing the stare of the fuse elements;
   selecting a predetermined fuse element; and
   compensating the trip point current reference based on a mimic circuit.

20. The method of claim 19 in which the mimic circuit is compensated based on changes in process, voltage, or temperature.

* * * * *